United States Patent
Lee et al.

(10) Patent No.: US 7,656,741 B2
(45) Date of Patent: Feb. 2, 2010

(54) ROW ACTIVE TIME CONTROL CIRCUIT AND A SEMICONDUCTOR MEMORY DEVICE HAVING THE SAME

(75) Inventors: Ji-Hyun Lee, Seoul (KR); Jong-Hyoung Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 12/007,432

(22) Filed: Jan. 10, 2008

(65) Prior Publication Data

US 2009/0097349 A1 Apr. 16, 2009

(30) Foreign Application Priority Data

Jan. 11, 2007 (KR) ........................ 10-2007-0003363

(51) Int. Cl.
*G11C 11/00* (2006.01)
(52) U.S. Cl. .............................. 365/230.06; 365/230.03
(58) Field of Classification Search ............ 365/230.06, 365/230.03
See application file for complete search history.

(56) References Cited

U.S. PATENT DOCUMENTS 7,158,427 B2 * 1/2007 Park ........................... 365/203

FOREIGN PATENT DOCUMENTS

| KR | 1020040093986 | 11/2004 |
| KR | 1020050067455 | 7/2005 |
| KR | 10-2005-0101683 | 10/2005 |
| KR | 1020050106828 | 11/2005 |

OTHER PUBLICATIONS

Office Action for corresponding Korean Application No. 10-2007-0003363 dated Feb. 29, 2008.

* cited by examiner

*Primary Examiner*—Michael T Tran
(74) *Attorney, Agent, or Firm*—Harness, Dickey & Pierce, P.L.C.

(57) ABSTRACT

A row active time control circuit is described that includes a master signal generating circuit and a row active control signal generating circuit. The master signal generating circuit generates one or more row active master signals based on an active command signal, a pre-charge command signal, and one or more row active control signals. The row active control signal generating circuit generates a pulse signal that oscillates based on the one or more row active master signals. The row active control signal also generates the one or more row active control signals by dividing a frequency of the generated pulse signal.

24 Claims, 8 Drawing Sheets

US 7,656,741 B2

ROW ACTIVE TIME CONTROL CIRCUIT AND A SEMICONDUCTOR MEMORY DEVICE HAVING THE SAME

PRIORITY STATEMENT

This application claims priority under 35 USC §119 to Korean Patent Application No. 10-2007-0003363, filed on Jan. 11, 2007 in the Korean Intellectual Property Office (KIPO), the entire disclosure of which is incorporated herein by reference.

BACKGROUND

1. Field

Example embodiments relate to a semiconductor memory device, and more particularly to a row active time control circuit and a semiconductor memory device having the row active time control circuit.

2. Description of the Related Art

Semiconductor memory devices may store received data in memory cells, and output the data stored in the memory cells to external devices. Semiconductor memory devices activate word-lines connected to memory cells in order to write data in the memory cells or read data from the memory cells. Conventionally, the word-lines are enabled based on and/or in response to an active command signal, and disabled based on and/or in response to a pre-charge command signal.

FIG. 1 is a timing diagram illustrating an operation of a conventional semiconductor memory device when a pre-charge command signal is generated after a maximum retention time of a row active control signal.

Referring to FIG. 1, a row active master signal PR_A is enabled (e.g., transitions from a low to high state) based on and/or in response to an active command signal ACT. The row active master signal PR_A is disabled (e.g., transitions from a high to low state) based on and/or in response to a pre-charge command signal PRE. A word-line enable signal WLE that activates word-lines is enabled or disabled based on and/or in response to the row active master signal PR_A.

Generally, a boosted voltage whose voltage level is higher than a power voltage level is applied to gates of memory cells when a word-line is activated. Typically, as the density of semiconductor memory devices increases, the size of transistors in the semiconductor memory devices gradually decreases. Further, transistors may be damaged when a high voltage such as the boosted voltage is applied to gates of the transistors for a long time. Damaged transistors are more likely to malfunction.

When a semiconductor memory device operates properly, the pre-charge command signal PRE is generated, and the word-line enable signal WLE is disabled within a maximum retention time tRAS_MAX of a row active control signal that the semiconductor memory device allows. FIG. 1 indicates the word-line enable signal is not disabled until after the maximum retention time tRAS_MAX. If the pre-charge command signal PRE is generated too late after the active command signal ACT is generated, memory transistors of a memory cell array may be stressed.

SUMMARY

Example embodiments are provided to substantially reduce and/or obviate one or more problems due to limitations and disadvantages of the related art.

Some example embodiments provide a row active time control circuit directed towards automatically disabling a word-line enable signal when a pre-charge command signal is generated too late after an active command signal is generated.

Some example embodiments provide a semiconductor memory device having a row active time control circuit.

Some example embodiments provide a method of controlling a row active time. In the method, a word-line enable signal is automatically disabled when a pre-charge command signal is generated too late after an active command signal is generated.

An example embodiment provides a row active time control circuit. The row active time control circuit may include a master signal generating circuit that generates at least one row active master signal based on and/or in response to an active command signal, a pre-charge command signal, and at least one row active control signal; and a row active control signal generating circuit that generates a pulse signal that oscillates based on and/or in response to the at least one row active master signal. The master signal generating circuit also generates the at least one row active control signal by dividing a frequency of the pulse signal.

According to an example embodiment, the master signal generating circuit may disable the one or more row active master signals based on and/or in response to a rising edge of the row active control signal.

According to an example embodiment, the row active control signals may have a period that is n (n is integer) times a period of the pulse signal.

According to an example embodiment, the row active control signal generating circuit may include an oscillator that generates the pulse signal that oscillates based on and/or in response to the at least one row active master signals, and at least one divider that generates one of the at least one row active control signal based on and/or in response to the pulse signal and a corresponding one of the at least one row active master signal.

According to an example embodiment, each divider may include a counter that generates pulse signals having a period that is 2N (N is positive integer) times a period of the pulse signal.

According to an example embodiment, the row active control signal generating circuit may further include a reset circuit that resets the at least one divider based on and/or in response to the at least one row active master signal.

According to an example embodiment, the row active control signal generating circuit may generate the pulse signal based on a first signal having self-refresh period information.

According to an example embodiment, the row active control signal generating circuit may include an oscillator that generates the pulse signal that oscillates based on and/or in response to the at least one row active master signal and the first signal, and at least one divider that generates one on the at least one row active control signal based on and/or in response to the pulse signal and a corresponding one of the at least one row active master signal.

According to an example embodiment, each divider may include a counter that generates pulse signals having a period that is 2N (N is positive integer) times a period of the pulse signal.

According to an example embodiment, the row active control signal generating circuit may further include a reset circuit that resets the at least on divider based on and/or in response to a corresponding one of the at least one row active master signal.

According to an example embodiment, the master signal generating circuit may increase a retention time of each of the at least one row active master signal based on and/or in response to at least one retention time control signal having minimum retention time information associated with the at least one row active master signal.

According to an example embodiment, the row active control signal generating circuit may change a time the at least one row active control signal is enabled based on and/or in response to the at least one retention time control signal having minimum retention time information associated with the at least one row active master signal.

According to an example embodiment, the row active control signal generating circuit may include an oscillator that generates the pulse signal that oscillates based on and/or in response to the at least one row active master signal, and at least one divider that generates one of the at least one row active control signal based on and/or in response to the pulse signal, a corresponding one of the at least one retention time control signal, and a corresponding one of the at least one row active master signal.

According to an example embodiment, each divider may include a counter that generates pulse signals having a period that is 2N (N is positive integer) times a period of the pulse signal.

According to an example embodiment, the row active control signal generating circuit may further include a reset circuit that resets the at least one divider based on and/or in response to a corresponding one of the at least one row active master signal.

An example embodiment provides a semiconductor memory device. The semiconductor memory device may include a row active time control circuit that generates at least one row active master signal that is disabled before the pre-charge command signal is generated when a pre-charge command signal is generated too late after an active command signal is generated, an address buffer that buffers at least one external address signal and generates at least one row address signal corresponding to the at least one external address signal, a decoder that decodes the at least one row address signal based on and/or in response to the at least one row active master signal and generates a word-line enable signal and a word-line boosting signal, and a word-line driver that generates at least one word-line control signal based on and/or in response to the word-line enable signal and the word-line boosting signal.

According to an example embodiment, the row active time control circuit may include a master signal generating circuit that generates at least one row active master signal based on and/or in response to an active command signal, a pre-charge command signal, and at least one row active control signal, and a row active control signal generating circuit that generates a pulse signal that oscillates based on and/or in response to the at least one row active master signal and that generates the at least one row active control signal by dividing a frequency of the pulse signal.

According to an example embodiment, the at least one row active control signal may have a period that is n (n is integer) times a period of the pulse signal.

According to an example embodiment, the row active control signal generating circuit may include an oscillator that generates the pulse signal that oscillates based on and/or in response to the at least one row active master signal, at least one divider that generates a corresponding one of the at least one row active control signal based on and/or in response to the pulse signal and a corresponding one of the at least one row active master signal, and a reset circuit that resets the at least one divider based on and/or in response the corresponding one of the at least one row active master signal.

According to an example embodiment, the row active control signal generating circuit may generate the pulse signal based on a first signal having self-refresh period information.

According to an example embodiment, the row active control signal generating circuit may include an oscillator that generates the pulse signal that oscillates based on and/or in response to the at least one row active master signal, at least one divider that generates a corresponding one of the at least one row active control signal based on and/or in response to the pulse signal and a corresponding one of the at least one row active master signal, and a reset circuit that resets the at least one divider based on and/or in response to the corresponding one of the at least one row active master signal.

According to an example embodiment, the master signal generating circuit may increase a retention time of each of the at least one row active master signal based on and/or in response to at least one retention time control signal having minimum retention time information associated with the at least one row active master signal.

According to an example embodiment, the row active control signal generating circuit may change a time the at least one row active control signal is enabled based on and/or in response to the at least one retention time control signal having minimum retention time information associated with the at least one row active master signal.

According to an example embodiment, the row active control signal generating circuit may include an oscillator that generates the pulse signal that oscillates based on and/or in response to the at least one row active master signal, and at least one divider that generates a corresponding one of the at least one row active control signal based on and/or in response to the pulse signal, a corresponding one of the at least one retention time control signal, and a corresponding one of the at least one row active master signal.

An example embodiment provides a method of controlling a row active time. The method may include generating at least one row active master signal based on and/or in response to an active command signal, a pre-charge command signal, and at least one row active control signal, generating a pulse signal that oscillates based on and/or in response to the at least one row active master signal. The at least one row active control signal is generated by dividing a frequency of the pulse signal.

An example embodiment provides a method of controlling a row active time. The method may include generating at least one row active master signal based on an active command signal, a pre-charge command signal, and at least one row active control signal; generating a pulse signal that oscillates based on the at least one row active master signal; and automatically disabling the at least one row active master signal when a pre-charge command signal is not generated prior to a maximum retention time associated with the at least one row active master signal.

BRIEF DESCRIPTION OF THE DRAWINGS

The above and other features and advantages of example embodiments will become more apparent by reviewing the detailed description of example embodiments of this disclosure in connection with the attached drawings in which.

DETAILED DESCRIPTION OF EXAMPLE EMBODIMENTS

Figure 1:
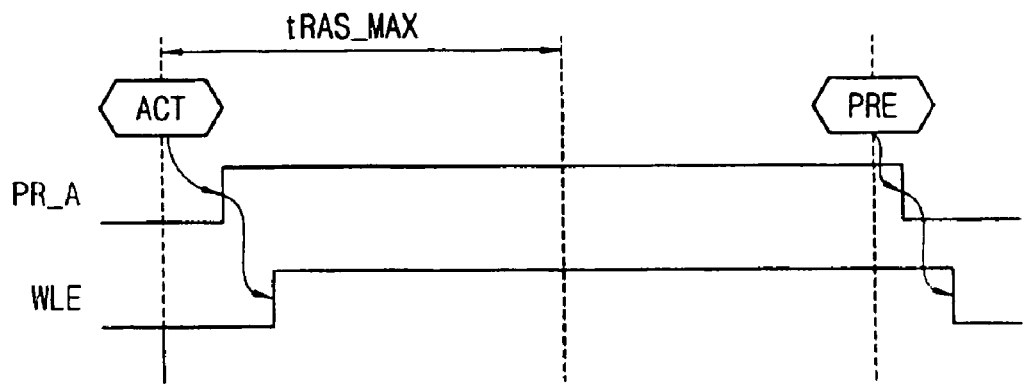
FIG. 1 is a timing diagram illustrating an operation of a conventional semiconductor memory device when a pre-charge command signal is generated after a maximum retention time of a row active control signal.

Example embodiments are described more fully below with reference to the accompanying drawings. Example embodiments may, however, be embodied in many different forms and should not be construed as limited to example embodiments set forth herein. Rather, these example embodiments are provided so that this disclosure will be thorough and complete, and will fully convey the scope of this disclosure to those skilled in the art. Like reference numerals refer to like elements throughout this disclosure.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of this disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing example embodiments and is not intended to be limiting.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
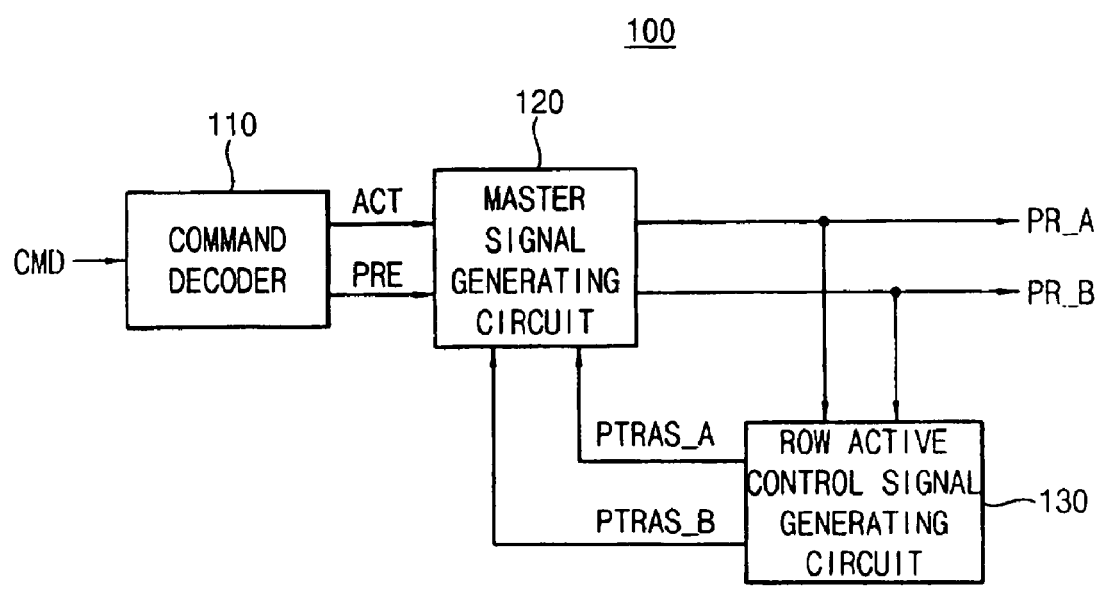
FIG. 2 is an example block diagram illustrating a row active time control circuit of a semiconductor memory device according to a first example embodiment.

FIG. 2 is a block diagram illustrating a row active time control circuit of a semiconductor memory device according to a first example embodiment.

Referring to FIG. 2, the row active time control circuit 100 includes a command decoder 110, a master signal generating circuit 120, and a row active control signal generating circuit 130.

The command decoder 110 may decode a command signal CMD and generate an active command signal ACT and a pre-charge command signal PRE. The command signal CMD may include a row address strobe signal, a column address strobe signal, a write enable signal, and a clock enable signal, for example. The master signal generating circuit 120 may generate a first row active master signal PR_A and a second row active master signal PR_B based on and/or in response to a received active command signal ACT, pre-charge command signal PRE, a first row active control signal PTRAS_A, and a second row active control signal PTRAS_B. The row active control signal generating circuit 130 may generate a pulse signal that oscillates based on and/or in response to the first row active master signal PR_A and the second row active master signal PR_B. The row active control signal generating circuit 130 may also generate the first row active control signal PTRAS_A and the second row active control signal PTRAS_B by dividing a frequency of the pulse signal POSC.

Figure 3:
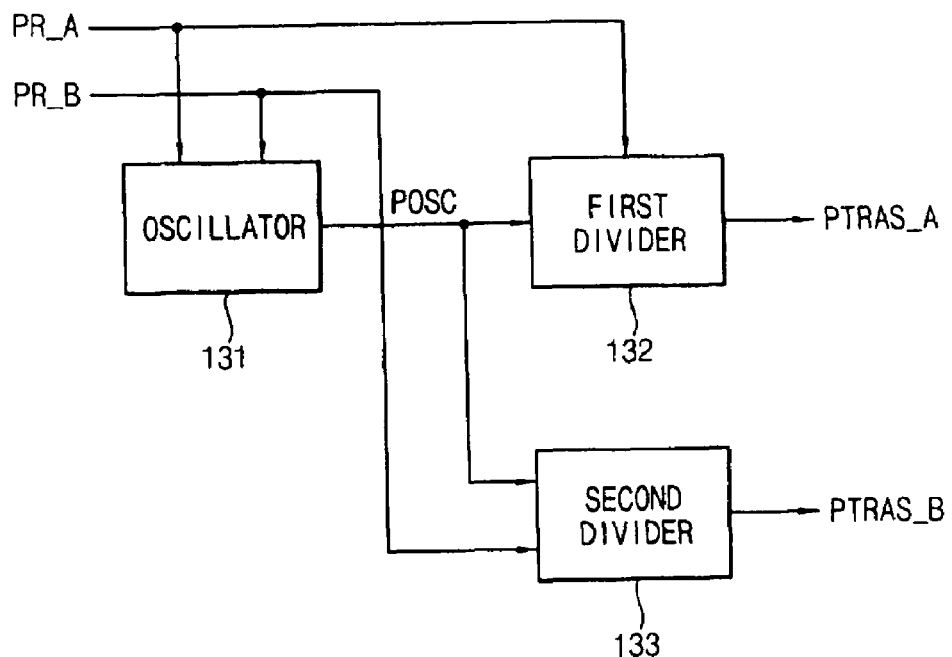
FIG. 3 is an example circuit diagram illustrating a row active control signal generating circuit in the row active time control circuit of FIG. 2.

FIG. 3 is a circuit diagram illustrating an example row active control signal generating circuit, which may be included in the row active time control circuit of FIG. 2.

Referring to FIG. 3, the row active control signal generating circuit 130a includes an oscillator 131, a first divider 132, and a second divider 133.

The oscillator 131 may generate a pulse signal POSC that oscillates based on and/or in response to a first row active master signal PR_A and a second row active master signal PR_B. The first divider 132 may generate a first row active control signal PTRAS_A based on and/or in response to the pulse signal POSC and the first row active master signal PR_A. The second divider 133 may generate a second row active control signal PTRAS_B based on and/or based on and/or in response to the pulse signal POSC and the second row active master signal PR_B.

Figure 4:
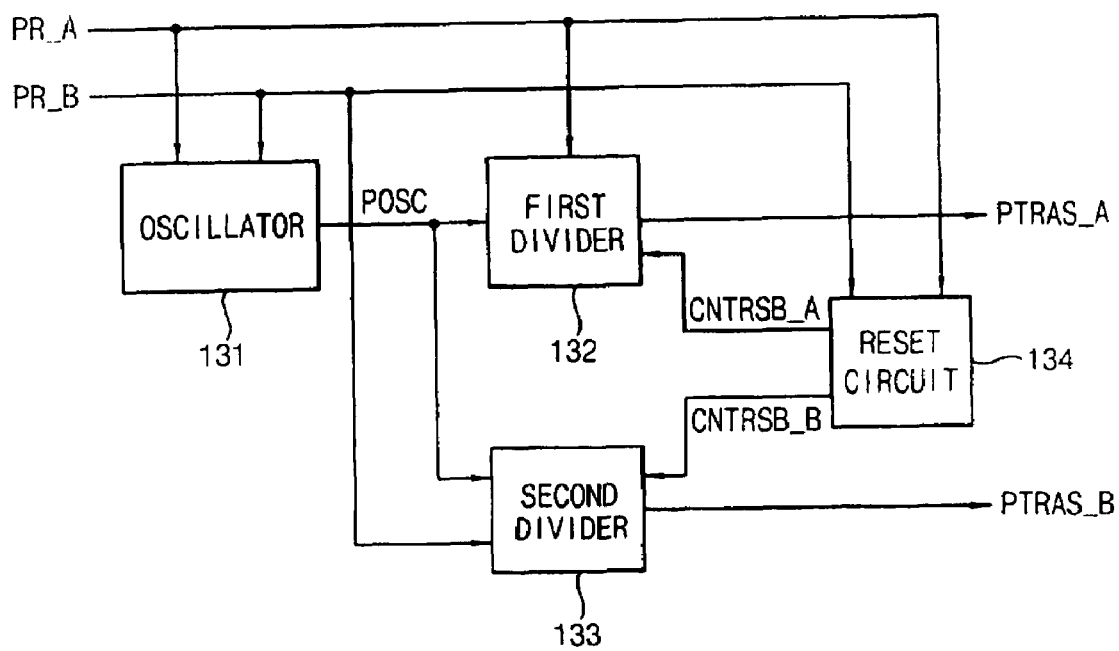
FIG. 4 is an example circuit diagram illustrating another row active control signal generating circuit in the row active time control circuit of FIG. 2.

FIG. 4 is a circuit diagram illustrating another example of a row active control signal generating circuit, which may be included in the row active time control circuit of FIG. 2.

Referring to FIG. 4, the row active control signal generating circuit 130b includes an oscillator 131, a first divider 132, a second divider 133, and a reset circuit 134.

The oscillator 131 may generate a pulse signal POSC that oscillates based on and/or based on and/or in response to a first row active master signal PR_A and a second row active master signal PR_B. The first divider 132 may generate a first row active control signal PTRAS_A based on and/or based on and/or in response to the pulse signal POSC, the first row active master signal PR_A, and a first reset signal CNTRSB_A. The second divider 133 may generate a second row active control signal PTRAS_B based on and/or based on and/or in response to the pulse signal POSC, the second active master signal PR_B, and a second reset signal CNTRSB_B. The reset circuit 134 may generate the first reset signal CNTRSB_A and the second reset signal CNTRSB_B based on and/or based on and/or in response to the received first row active master signal PR_A and the received second row active master signal PR_B.

The row active control signal generating circuit 130b of FIG. 4 may reset the first divider 132 and the second divider 133 based on and/or in response to the received first row active master signal PR_A and the received second row active master signal PR_B. In particular, the reset circuit 134 included in the row active control signal generating circuit 130b may reset the first divider 132 and the second divider 133 based on and/or in response to the received first row active master signal PR_A and the received second row active master signal PR_B.

Figure 5:
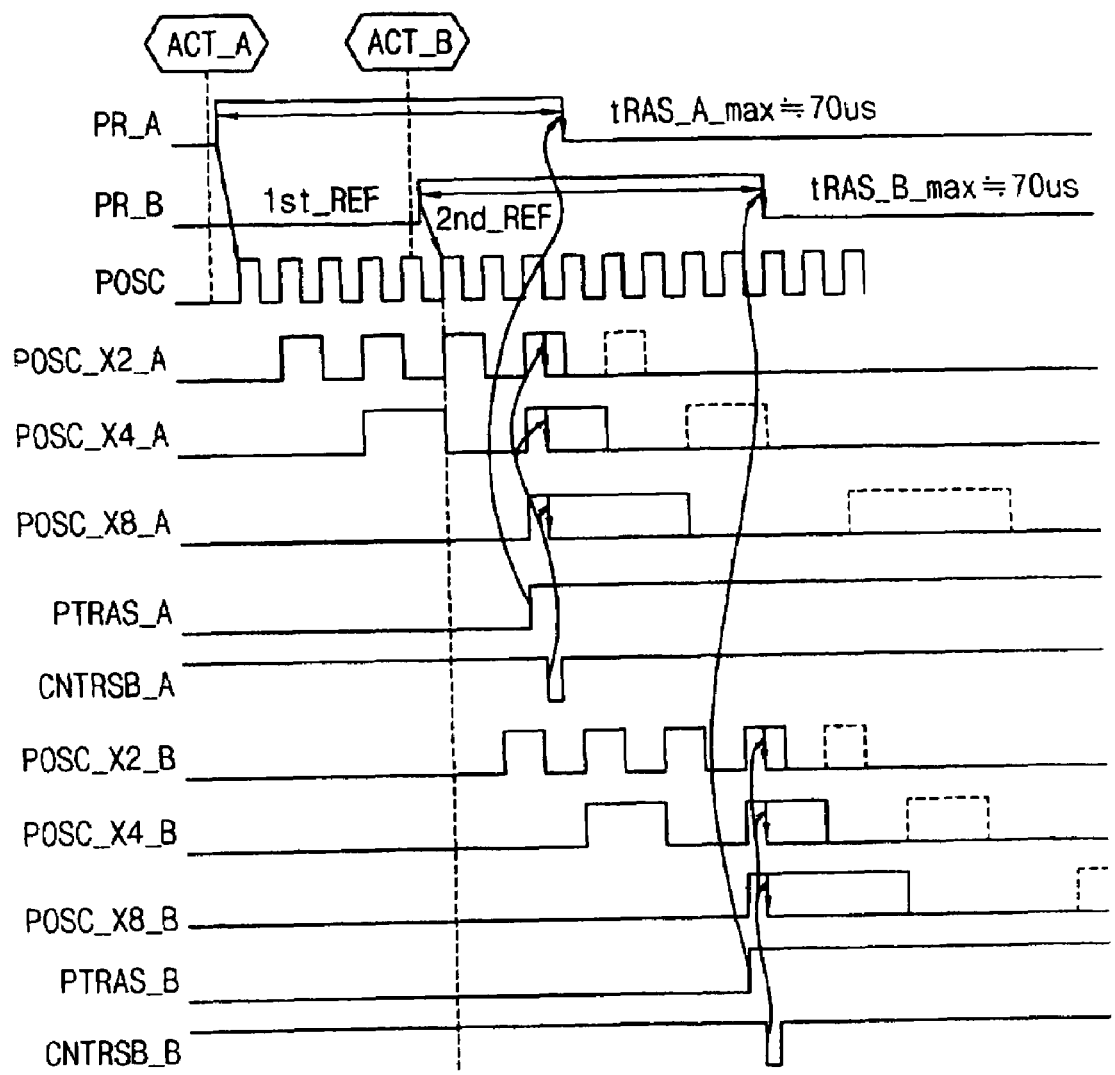
FIG. 5 is a timing diagram illustrating an example operation of the row active time control circuit of FIG. 2.

FIG. 5 is a timing diagram illustrating an example operation of the row active time control circuit of FIG. 2.

Referring to FIG. 5, ACT_A represents an active command signal for a bank A, and ACT_B represents an active command signal for a bank B. tRAS_A_max represents a maximum retention time of a row active control signal for the bank A, and tRAS_B_max represents a maximum retention time of a row active control signal for the bank B. POSC represents a pulse signal generated by an oscillator 131 included in the row active control signal generating circuit 130a of FIG. 3, for example. POSC_X2_A represents a pulse signal having a period that is two times a period of the pulse signal POSC. POSC_X4_A represents a pulse signal having a period that is four times the period of the pulse signal POSC. POSC_X8_A represents a pulse signal having a period that is eight times the period of the pulse signal POSC. The POSC_X2_A, the POSC_X4_A, and the POSC_X8_A may be used for, and/or to control operations related to, bank A. POSC_X2_B represents a pulse signal having a period that is two times the period of the pulse signal POSC. POSC_X4_B represents a pulse signal having a period that is four times the period of the pulse signal POSC. POSC_X8_B represents a pulse signal having a period that is eight times the period of the pulse signal POSC. The POSC_X2_B, the POSC_X4_B, and the POSC_X8_B are used for, and/or to control operations related to, the bank B.

Hereinafter, an example operation of the row active time control circuit 100 according to a first example embodiment is described referring to FIGS. 2 through 5.

Referring to FIG. 2, the first row active master signal PR_A is a signal for controlling a row activation of the bank A. The second row active master signal PR_B is a signal for controlling a row activation of the bank B. The first row active control signal PTRAS_A is a signal for controlling the first row active master signal PR_A. The second row active control signal PTRAS_B is a signal for controlling the second row active master signal PR_B.

Although the row active time control circuit 100 of a semiconductor memory device having two banks is described in FIG. 2, a row active time control circuit may be easily modified for a semiconductor memory device having any number of banks.

According to an example embodiment, the row active time control circuit 100 automatically disables the row active master signals PR_A and PR_B when the pre-charge command signal PRE is generated too late after the active command signal ACT is generated. Stated differently, the row active time control circuit automatically disables the row active master signals PR_A and PR_B before a maximum retention time of a row active master signals has passed. Thus, a semiconductor memory device having the row active time control circuit 100 may automatically disable a word-line enable signal, thereby preventing memory transistors in a memory cell array from being overstressed when the pre-charge command signal PRE is generated too late after the active command signal ACT is generated.

The row active control signal generating circuit 130 shown in FIG. 2 may generate a pulse signal POSC that oscillates based on and/or in response to the first row active master signal PR_A associated with the bank A and the second row active master signal PR_B associated with the bank B. Further, the row active control signal generating circuit 130 may generate the first row active control signal PTRAS_A associated with the bank A and the second row active control signal PTRAS_B associated with the bank B by dividing a frequency of the pulse signal POSC according to an example embodiment.

According to an example embodiment, each of the dividers 132 and 133 shown in FIGS. 3 and 4 may include a counter that generates pulse signals having a period that is 2N (N is positive integer) times a period of a pulse signal POSC that is an output of the oscillator 131.

Referring to FIG. 5, the first row active master signal PR_A is enabled based on and/or in response to the active command signal ACT_A associated with the bank A. The second row active master signal PR_B is enabled based on and/or in response to the active command signal ACT_B associated with the bank B. The pulse signal POSC is generated based on and/or in response to a rising edge 1st_REF of the first row active master signal PR_A and a rising edge 2nd_REF of the second row active master signal PR_B.

The pulse signals POSC_X2_A, POSC_X4_A, and POSC_X8_A are generated by the first divider 132 according to an example embodiment. The first row active control signal PTRAS_A associated with the bank A is generated based on and/or in response to the pulse signal POSC_X8_A. The first row active master signal PR_A is disabled based on and/or in response to a rising edge of the first row active control signal PTRAS_A. The pulse signals POSC_X2_B, POSC_X4_B, and POSC_X8_B are generated by the second divider 133 according to an example embodiment. The second row active master signal PR_B is disabled based on and/or in response to a rising edge of the second row active control signal PTRAS_B.

Thus, according to an example embodiment, the row active time control circuit 100 of FIG. 2 may automatically disable the row active master signals PR_A and PR_B, and prevent memory transistors in a memory cell array from being overstressed when the pre-charge command signal PRE is generated too late after the active command signal ACT is generated (e.g., when the pre-charge command signal PRE occurs after a maximum retention time of a row active control signal has passed).

Figure 6:
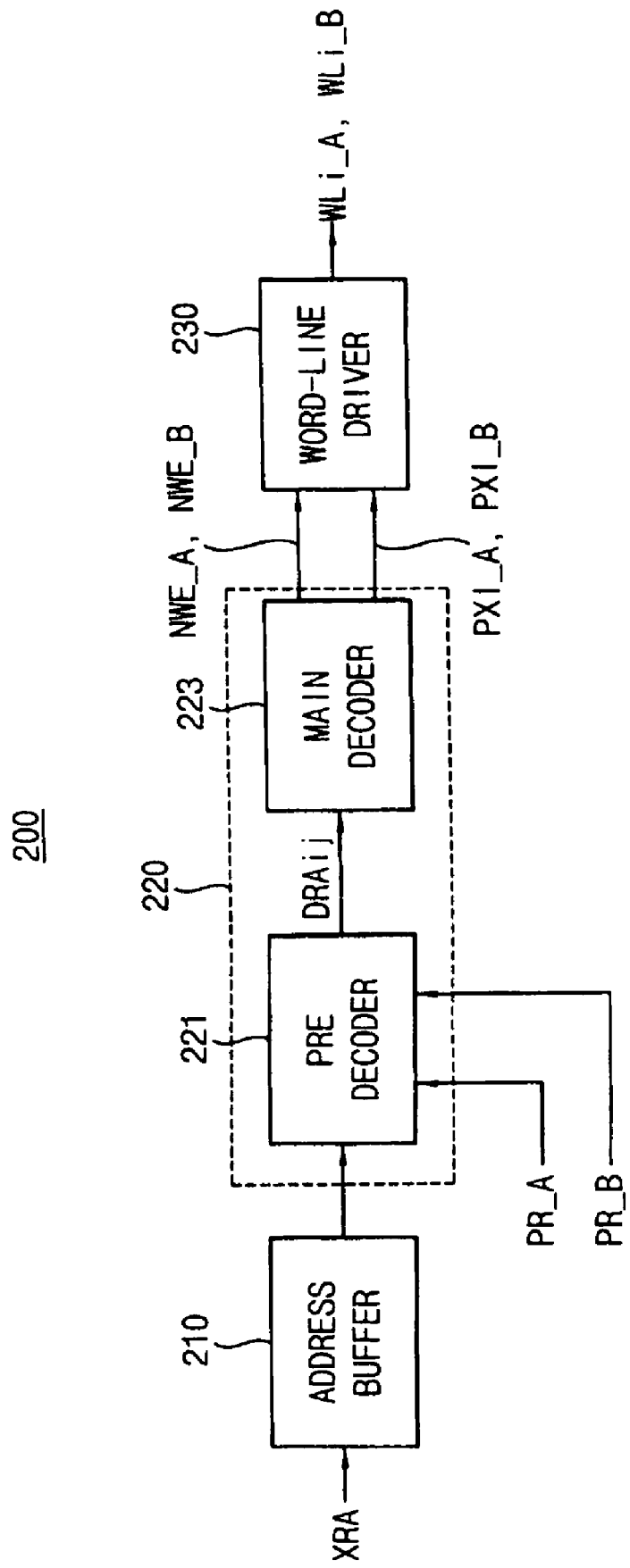
FIG. 6 is an example block diagram illustrating a semiconductor memory device that operates based on and/or in response to a row active master signal generated by the row active time control circuit of FIG. 2.

FIG. 6 is an example block diagram illustrating a semiconductor memory device that operates based on and/or in response to a row active master signal generated by the row active time control circuit of FIG. 2.

Referring to FIG. 6, the semiconductor memory device 200 includes an address buffer 210, a decoder 220, and a word-line driver 230. A first row active master signal PR_A and a second row active master signal PR_B may be disabled before a pre-charge command signal PRE is generated if the pre-charge command signal PRE is generated too late after the activation of an active command signal ACT Stated differently, the first and second row active master signals PR_A and PR_B are automatically disabled before a maximum retention time of the first and second row active master signals PR_A and PR_B has passed. The first row active master signal PR_A and the second row active master signal PR_B may be generated by a row active time control circuit 100 of FIG. 2. The address buffer 210 may buffer external address signals XRA, and may generate row address signals corresponding to the external address signals XRA. The decoder 220 may decode the row address signals based on and/or in response to the first row active master signal PR_A and the second row active master signal PR_B. Further, the decoder 220 may generate a word-line enable signal NWE_A and NWE_B and a word-line boosting signal PXI_A and PXI_B. The word-line driver 230 may generate word-line control signals WLi_A and WLi_B based on and/or in response to the word-line enable signal NWE_A and NWE_B and the word-line boosting signal PXI_A and PXI_B.

Still referring to FIG. 6, the decoder 220 includes a predecoder 221 and a main decoder 223.

The predecoder 221 may decode the row address signals based on and/or in response to the first row active master signal PR_A and the second row active master signal PR_B, and may generate a decoded row address signals DRAij. The main decoder 223 may decode the row address signals DRAij, and may generate the word-line enable signal NWE_A and NWE_B and the word-line boosting signal PXI_A and PXI_B.

According to an example embodiment, the word-line enable signal NWE_A and NWE_B may automatically be disabled because the row active master signals PR_A and PR_B are automatically disabled when the pre-charge command signal PRE is generated too late after the active command signal ACT is generated. Thus, memory transistors in a memory cell array may be prevented from being overstressed according to an example embodiment.

Figure 7:
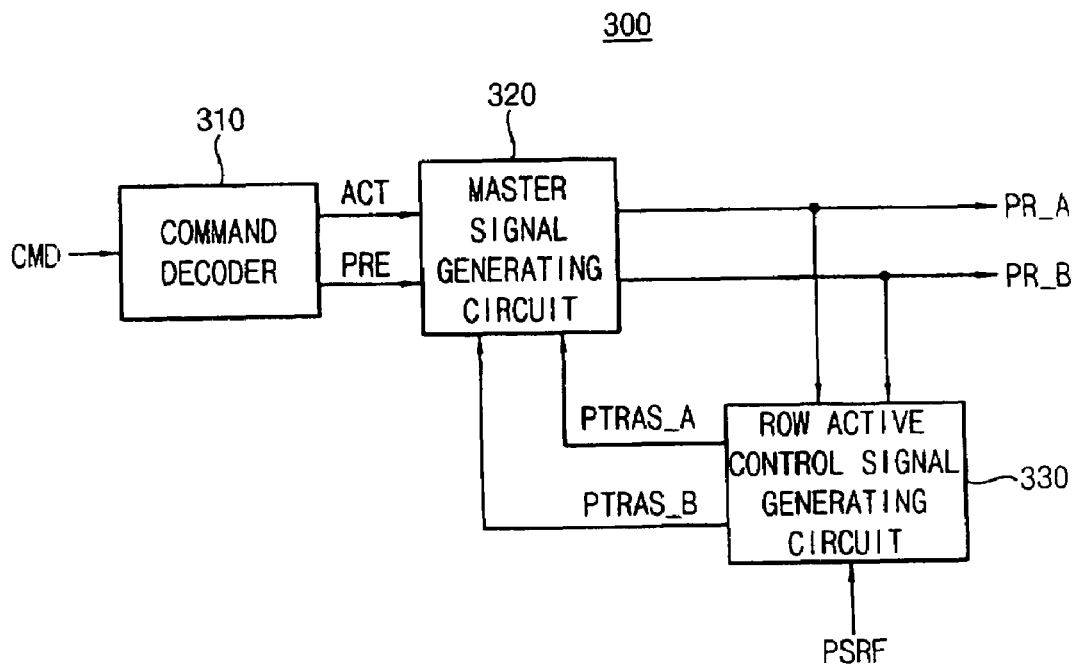
FIG. 7 is an example block diagram illustrating a row active time control circuit of a semiconductor memory device according to a second example embodiment.

FIG. 7 is an example block diagram illustrating a row active time control circuit of a semiconductor memory device according to a second example embodiment.

Referring to FIG. 7, the row active time control signal 300 includes a command decoder 310, a master signal generating circuit 320, and a row active control signal generating circuit 330.

The command decoder 310 may decode a command signal CMD, and may generate an active command signal ACT and a pre-charge command signal PRE. The command signal CMD may include a row address strobe signal RASB, a column address strobe signal CASB, a write enable signal WEB, and a clock enable signal CKE, for example. The master signal generating circuit 320 may generate a first row active master signal PR_A and a second row active master signal PR_B based on and/or in response to the active command signal ACT, the pre-charge command signal PRE, a first row active control signal PTRAS_A, and a second row active control signal PTRAS_B. The row active control signal generating circuit 330 may generate a pulse signal POSC that oscillates based on and/or in response to a first signal PSRF having the first row active master signal PR_A, the second row active master signal PR_B, and a self-refresh period information. The row active control signal generating circuit 330 may also generate the first row active control signal PTRAS_A and the second row active control signal PTRAS_B by dividing a frequency of the pulse signal POSC.

The row active time control circuit 300 of FIG. 7 may determine an oscillation frequency of an oscillator of the row active control signal generating circuit 330 based on and/or in response to the first signal PSRF having the self-refresh period information.

Figure 8:
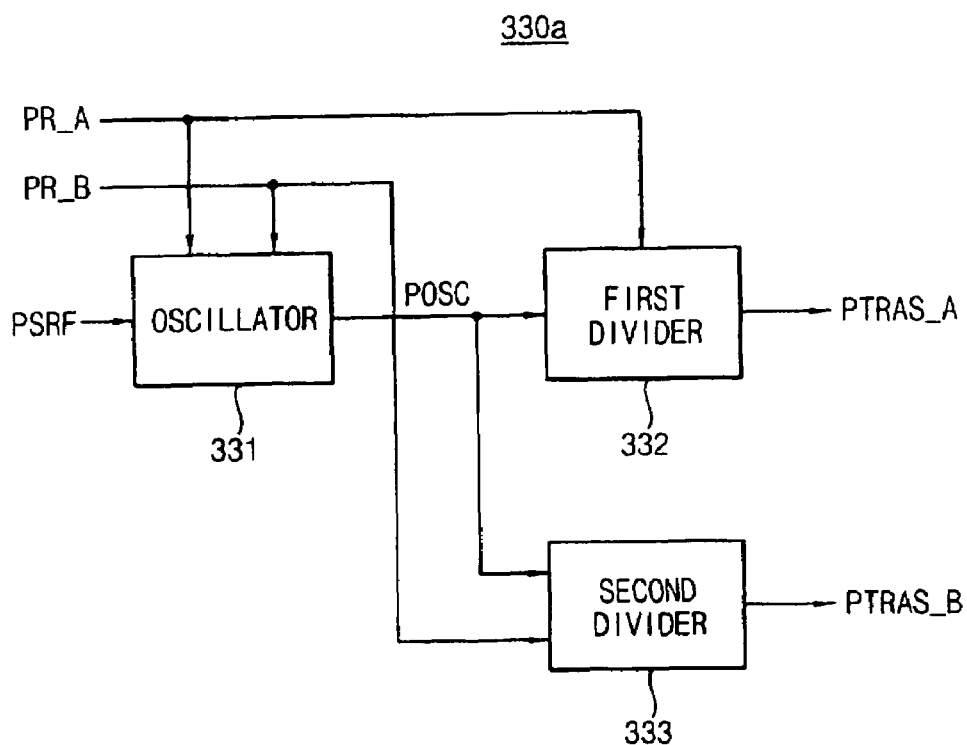
FIG. 8 is an example circuit diagram illustrating a row active control signal generating circuit in the row active time control circuit of FIG. 7.

FIG. 8 is an example circuit diagram illustrating a row active control signal generating circuit in the row active time control circuit of FIG. 7.

Referring to FIG. 8, the row active control signal generating circuit 330a includes an oscillator 331, a first divider 332, and a second divider 333.

The oscillator 331 may generate a pulse signal POSC that oscillates based on and/or in response to a first signal PSRF having a first row active master signal PR_A, a second row active master signal PR_B, and self-refresh period information. The first divider 332 may generate a first row active control signal PTRAS_A based on and/or in response to the pulse signal POSC and the first row active master signal PR_A. The second divider 333 may generate a second row active control signal PTRAS_B based on and/or in response to the pulse signal POSC and the second row active master signal PR_B.

Figure 9:
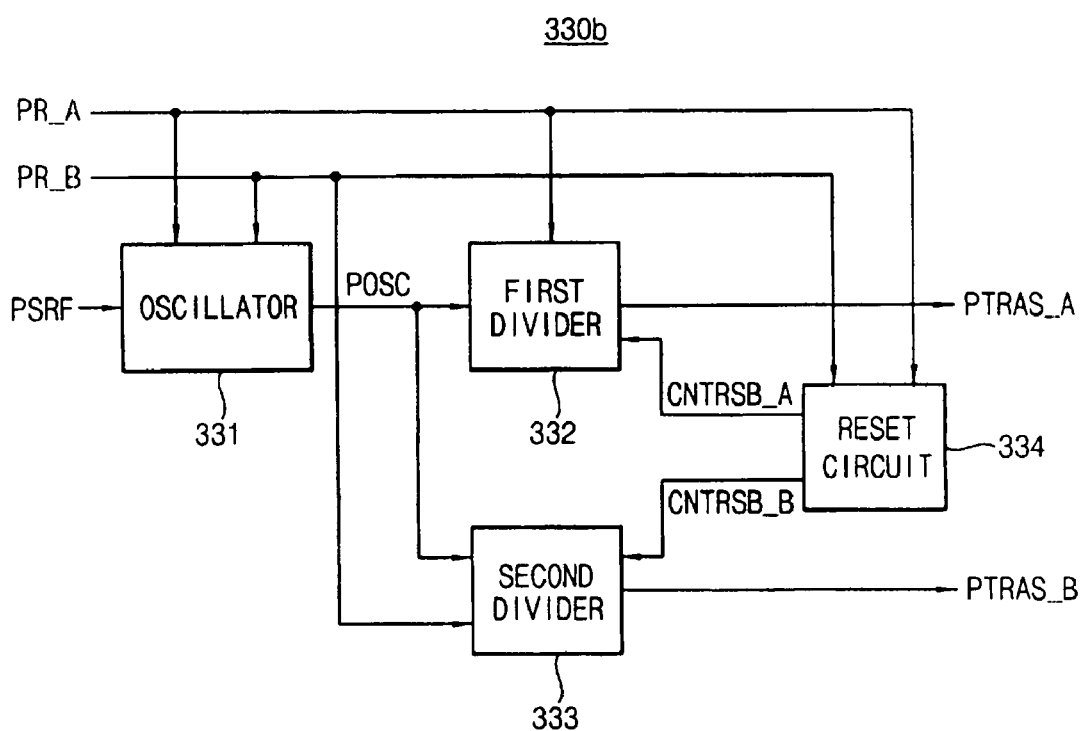
FIG. 9 is an example circuit diagram illustrating another row active control signal generating circuit in the row active time control circuit of FIG. 7.

Each of the dividers 332 and 333 shown in FIGS. 8 and 9 may include a counter that generates pulse signals having a period that is 2N (N is positive integer) times a period of a pulse signal POSC that is an output of the oscillator 331.

FIG. 9 is an example circuit diagram illustrating another row active control signal generating circuit in the row active time control circuit of FIG. 7.

Referring to FIG. 9, the row active control signal generating circuit 330b includes an oscillator 331, a first divider 332, a second divider 333, and a reset circuit 334.

The oscillator 331 may generate a pulse signal POSC that oscillates based on and/or in response to a first signal PSRF having a first row active master signal PR_A, a second row active master signal PR_B, and a self-refresh period information. The first divider 332 may generate a first row active control signal PTRAS_A based on and/or in response to the pulse signal POSC, the first row active master signal PR_A, and a first reset signal CNTRSB_A. The second divider 333 may generate a second row active control signal PTRAS_B based on and/or in response to the pulse signal POSC, the second row active master signal PR_B, and a second reset signal CNTRSB_B. The reset circuit 334 may generate the first reset signal CNTRSB_A and the second reset signal CNTRSB_B based on and/or in response to the first row active master signal PR_A and the second row active master signal PR_B.

Figure 10:
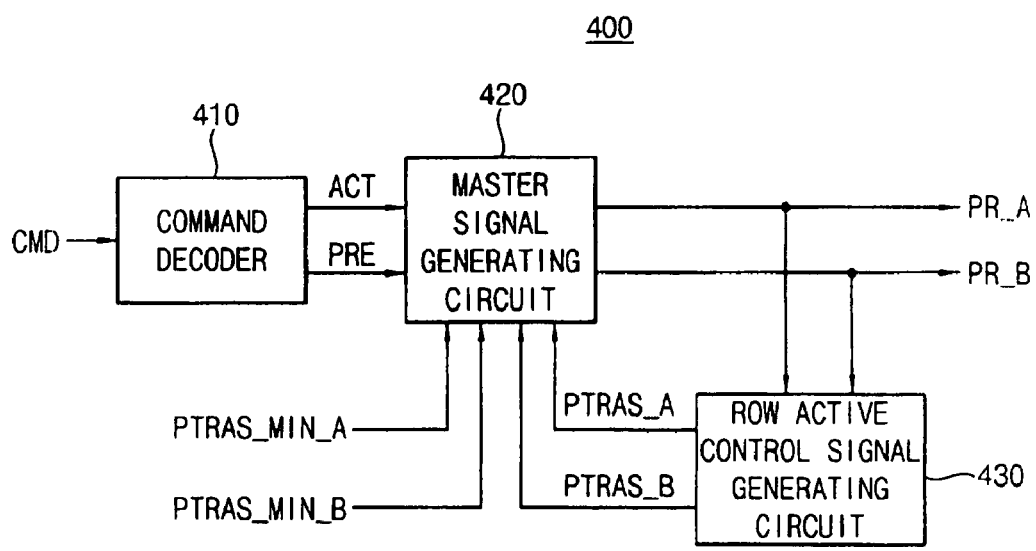
FIG. 10 is an example block diagram illustrating a row active time control circuit of a semiconductor memory device according to a third example embodiment.

FIG. 10 is an example block diagram illustrating a row active time control circuit of a semiconductor memory device according to a third example embodiment.

Referring to FIG. 10, the row active time control circuit 400 includes a command decoder 410, a master signal generating circuit 420, and a row active control signal generating circuit 430.

The command decoder 410 may decode a command signal CMD, and may generate an active command signal ACT and a pre-charge command signal PRE. The command signal CMD may include a row address strobe signal RASB, a column address strobe signal CASB, a write enable signal WEB, and a clock enable signal CKE, for example. The master signal generating circuit 420 may generate a first row active master signal PR_A and a second row active master signal PR_B based on and/or in response to the active command signal ACT, the pre-charge command signal PRE, a first row active control signal PTRAS_A, a second row active control signal PTRAS_B, a second signal PTRAS_MIN_A having a minimum retention time information for a bank A, and a third signal PTRAS_MIN_B having a minimum retention time information for a bank B. The row active control signal generating circuit 430 may generate a pulse signal POSC that oscillates based on and/or in response to the first row active master signal PR_A and the second row active master signal PR_B. The row active control signal generating circuit 430 may also generate the first row active control signal PTRAS_A and the second row active control signal PTRAS_B by dividing a frequency of the pulse signal POSC.

The row active time control circuit 400 of FIG. 10 includes the master signal generating circuit 420. The master signal generating circuit 420 may increase a retention time of the first row active master signal PR_A and the second row active master signal PR_B based on and/or in response to the second signal PTRAS_MIN_A having a minimum retention time information for the bank A and the third signal PTRAS_MIN_B having a minimum retention time information for the bank B. Thus, a semiconductor memory device having the row active time control circuit 400 may automatically disable the row active master signals PR_A and PR_B when the pre-charge command signal PRE is generated too late after the active command signal ACT is generated. The semiconductor memory device having the row active time control circuit 400 may automatically disable a word-line enable signal, and prevent memory transistors in a memory cell array from being overstressed when the pre-charge command signal PRE is generated too late after the active command signal ACT is generated. In addition, the semiconductor memory device having the row active time control circuit 400 may increase a retention time of the active master signals PR_A and PR_B to ensure an enough time before word-lines are activated when the pre-charge command signal PRE is generated too early after the active command signal ACT is generated.

Figure 11:
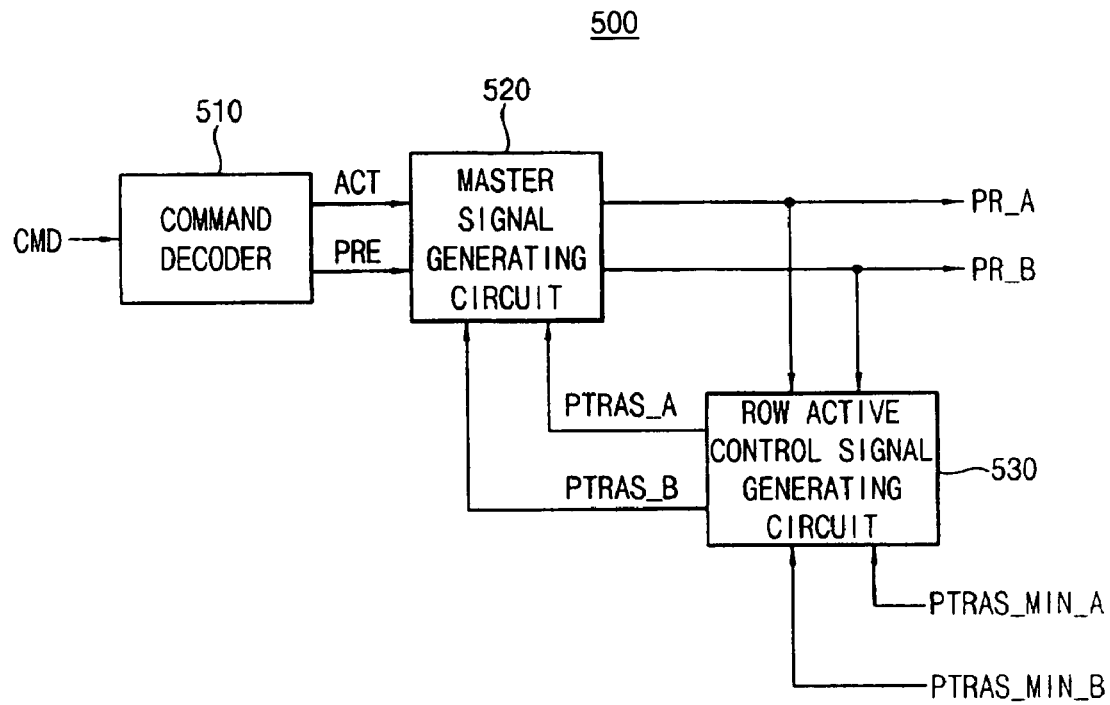
FIG. 11 is an example block diagram illustrating a row active time control circuit of a semiconductor memory device according to a fourth example embodiment.

FIG. 11 is a block diagram illustrating a row active time control circuit of a semiconductor memory device according to a fourth example embodiment.

Referring to FIG. 11, the row active time control circuit 500 includes a command decoder 510, a master signal generating circuit 520, and a row active control signal generating circuit 530.

The command decoder 510 may decode a command signal CMD, and generate an active command signal ACT and a pre-charge command signal PRE. The command signal CMD may include a row address strobe signal RASB, a column address strobe signal CASB, a write enable signal WEB, and a clock enable signal CKE, for example. The master signal generating circuit 520 may generate a first row active master signal PR_A and a second row active master signal PR_B based on and/or in response to the active command signal ACT, the pre-charge command signal PRE, a first row active control signal PTRAS_A, and a second row active control signal PTRAS_B. The row active control signal generating circuit 530 may generate a pulse signal POSC that oscillates based on and/or in response to the first row active master signal PR_A, the second row active master signal PR_B, a second signal PTRAS_MIN_A having a minimum retention time information for a bank A, and a third signal PTRAS_MIN_B having a minimum retention time information for a bank B. The row active control signal generating circuit 530 may also generate the first row active control signal PTRAS_A and the second row active control signal PTRAS_B by dividing a frequency of the pulse signal POSC.

The row active time control circuit 500 shown in FIG. 11 includes the row active control signal generating circuit 530. The row active control signal generating circuit 530 may change time points where the first row active control signal PTRAS_A and the second row active control signal PTRAS_B are enabled based on and/or in response to the second signal PTRAS_MIN_A and the third signal PTRAS_MIN_B. Thus, a semiconductor memory device having the row active time control circuit 500 may automatically disable the row active master signals PR_A and PR_B when the pre-charge command signal PRE is generated too late after the active command signal ACT is generated according to an example embodiment. The semiconductor memory device having the row active time control circuit 500 may automatically disable a word-line enable signal, and prevent memory transistors in a memory cell array from being overstressed when the pre-charge command signal PRE is generated too late after the active command signal ACT is generated. In addition, the semiconductor memory device having the row active time control circuit 500 may increase a retention time of the active master signals PR_A and PR_B to ensure an enough time before word-lines are activated when the pre-charge command signal PRE is generated too early after the active command signal ACT is generated according to an example embodiment.

Figure 12:
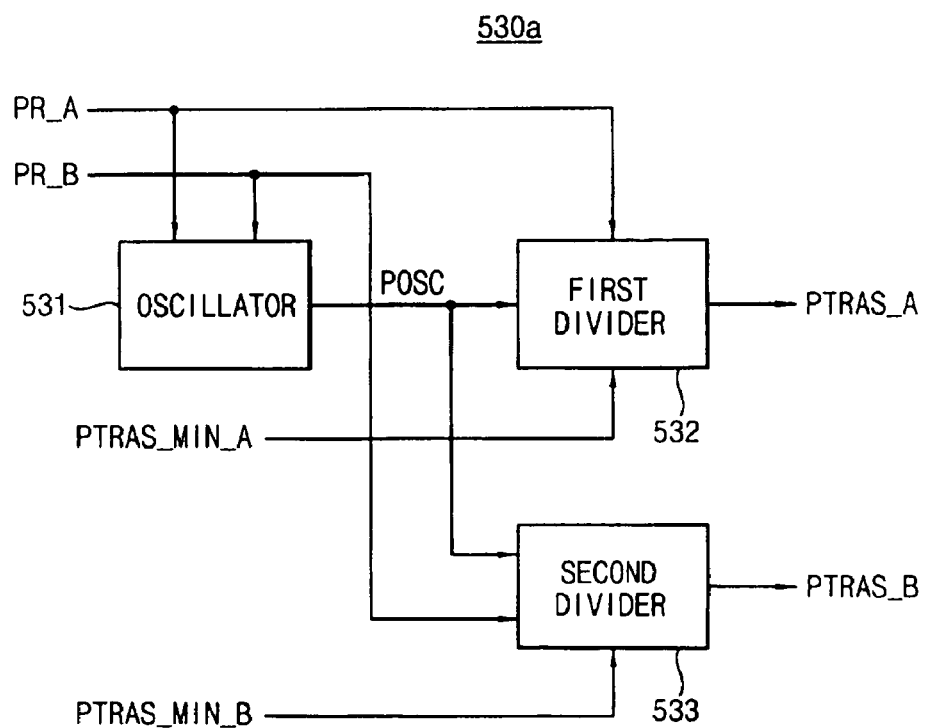
FIG. 12 is an example circuit diagram illustrating a row active control signal generating circuit in the row active time control circuit of FIG. 11.

FIG. 12 is an example circuit diagram illustrating a row active control signal generating circuit in the row active time control circuit of FIG. 11.

Referring to FIG. 12, the row active control signal generating circuit 530a includes an oscillator 531, a first divider 532, and a second divider 533.

The oscillator 531 may generate a pulse signal POSC that oscillates based on and/or in response to a first row active master signal PR_A and a second row active master signal PR_B. The first divider 532 may generate a first row active control signal PTRAS_A based on and/or in response to the pulse signal POSC, the first row active master signal PR_A, and a second signal PTRAS_MIN_A having a minimum retention time information for a bank A. The second divider 533 may generate a second row active control signal PTRAS_B based on and/or in response to the pulse signal POSC, the second row active master signal PR_B, and a third signal PTRAS_MIN_B having a minimum retention time information for a bank B.

Each of the dividers 532 and 533 shown in FIG. 12 may include a counter that generates pulse signals having a period that is 2N (N is positive integer) a period of a pulse signal POSC that is an output of the oscillator 531.

Figure 13:
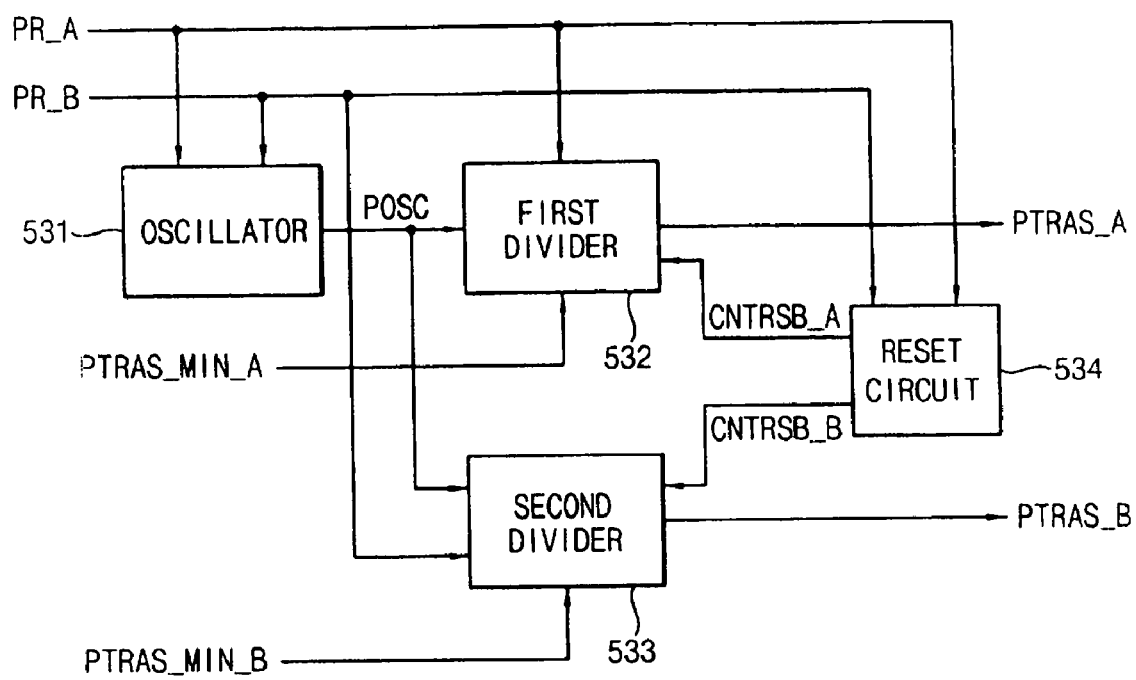
FIG. 13 is an example circuit diagram illustrating another row active control signal generating circuit in the row active time control circuit of FIG. 11.

FIG. 13 is an example circuit diagram illustrating another row active control signal generating circuit in the row active time control circuit of FIG. 11.

Referring to FIG. 13, the row active control signal generating circuit 530b includes an oscillator 531, a first divider 532, a second divider 533, and a reset circuit 534.

The oscillator 531 may generate a pulse signal POSC that oscillates based on and/or in response to a first row active master signal PR_A and a second row active master signal PR_B. The first divider 532 may generate a first row active control signal PTRAS_A based on and/or in response to the pulse signal POSC, the first row active master signal PR_A, a first reset signal CNTRSB_A, and a second signal PTRAS_MIN_A having a minimum retention time information for a bank A. The second divider 533 may generate a second row active control signal PTRAS_B based on and/or in response to the pulse signal POSC, the second row active master signal PR_B, a second reset signal CNTRSB_B, and a third signal PTRAS_MIN_B having a minimum retention time information for a bank B. The reset circuit 534 may generate the first reset signal CNTRSB_A and the second reset signal CNTRSB_B based on and/or in response to the first row active master signal PR_A and the second row active master signal PR_B.

As descried above, example embodiments of a row active time control circuit can automatically disable a row active master signal when a pre-charge command signal is generated too late after an active command signal is generated. Thus, example embodiments of a semiconductor memory device having the row active time control circuit may automatically disable the word-line enable signal, and prevent memory transistors in a memory cell array from being overstressed when the pre-charge command signal is generated too late after the active command signal is generated. In addition, example embodiments of a semiconductor memory device can increase a retention time of active master signals to ensure an enough time before word-lines are activated when the pre-charge command signal is generated too early after the active command signal is generated.

While example embodiments and related advantages have been described above in detail, it should be understood that various changes, substitutions and alterations may be made herein without departing from the scope of the invention.

What is claimed is:

1. A row active time control circuit, comprising:
   a master signal generating circuit configured to generate at least one row active master signal based on an active command signal, a pre-charge command signal, and at least one row active control signal; and
   a row active control signal generating circuit configured to generate a pulse signal that oscillates based on the at least one row active master signal, and configured to generate the at least one row active control signal by dividing a frequency of the pulse signal,
   wherein the at least one row active master signal is disabled before the pre-charge command signal is generated.

2. The row active time control circuit of claim 1, wherein the master signal generating circuit disables the at least one row active master signal based on a rising edge of the at least one row active control signal.

3. The row active time control circuit of claim 1, wherein the at least one row active control signal has a period that is n times a period of the pulse signal, where n is integer.

4. The row active time control circuit of claim 1, wherein the row active control signal generating circuit includes:
   an oscillator configured to generate the pulse signal that oscillates based on the at least one row active master signal; and
   at least one divider configured to generate one of the at least one row active control signal based on the pulse signal and a corresponding one of the at least one row active master signal.

5. The row active time control circuit of claim 4, wherein each divider includes:
   a counter configured to generate at least one pulse signal having a period that is 2N times a period of the pulse signal, where N is a positive integer.

6. The row active time control circuit of claim 4, wherein the row active control signal generating circuit further includes:
   a reset circuit configured to reset the at least one divider based on the corresponding one of the at least one row active master signal.

7. The row active time control circuit of claim 1, wherein the row active control signal generating circuit generates the pulse signal based on a first signal having self-refresh period information.

8. The row active time control circuit of claim 7, wherein the row active control signal generating circuit includes:
   an oscillator configured to generate the pulse signal that oscillates based on the at least one row active master signal and the first signal; and
   at least one divider configured to generate one of the at least one row active control signal based on the pulse signal and a corresponding one of the at least one row active master signal.

9. The row active time control circuit of claim 8, wherein each divider includes:
   a counter configured to generate at least one pulse signal having a period that is 2N times a period of the pulse signal, where N is a positive integer.

10. The row active time control circuit of claim 8, wherein the row active control signal generating circuit further includes:
    a reset circuit configured to reset the at least one divider based on the corresponding one of the at least one row active master signal.

11. The row active time control circuit of claim 1, wherein the master signal generating circuit increases a retention time of each of the at least one row active master signal based on at least one retention time control signal having minimum retention time information associated with the at least one row active master signal.

12. The row active time control circuit of claim 1, wherein the row active control signal generating circuit is configured to change a time the at least one row active control signal is enabled based on at least one retention time control signal having a minimum retention time information associated with the at least one row active master signal.

13. The row active time control circuit of claim 12, wherein the row active control signal generating circuit includes:
    an oscillator configured to generate the pulse signal that oscillates based on the at least one row active master signal; and
    at least one divider configured to generate one of the at least one row active control signal based on the pulse signal, a corresponding one of the at least one retention time control signal, and a corresponding one of the at least one row active master signal.

14. The row active time control circuit of claim 13, wherein each divider includes:
    a counter configured to generate at least one pulse signal having a period that is 2N times a period of the pulse signal, where N is a positive integer.

15. The row active time control circuit of claim 13, wherein the row active control signal generating circuit further includes:
    a reset circuit configured to reset the at least one divider based on the corresponding one of the at least one row active master signal.

16. A semiconductor memory device, comprising:
    a row active time control circuit configured to generate at least one row active master signal, the at least one row active master signal being disabled before the pre-charge command signal is generated;
    an address buffer configured to buffer at least one external address signal, and configured to generate at least one row address signal corresponding to the at least one external address signal;

a decoder configured to decode the at least one row address signal based on the at least one row active master signal, and configured to generate a word-line enable signal and a word-line boosting signal; and a word-line driver configured to generate at least one word-line control signal based on the word-line enable signal and the word-line boosting signal.

17. The semiconductor memory device of claim 16, wherein the row active time control circuit includes:

a master signal generating circuit configured to generate at least one row active master signal based on an active command signal, a pre-charge command signal, and at least one row active control signal; and a row active control signal generating circuit configured to generate a pulse signal that oscillates based on the at least one row active master signal, and configured to generate the at least one row active control signal by dividing a frequency of the pulse signal.

18. The semiconductor memory device of claim 17, wherein the at least one row active control signal have a period that is n times a period of the pulse signal, where n is integer.

19. The semiconductor memory device of claim 17, wherein the row active control signal generating circuit includes:

an oscillator configured to generate the pulse signal that oscillates based on the at least one row active master signal;

at least one divider configured to generate one of the at least one row active control signal based on the pulse signal and a corresponding one of the at least one row active master signal; and a reset circuit configured to reset the at least one divider based on the corresponding one of the at least one row active master signal.

20. The semiconductor memory device of claim 17, wherein the row active control signal generating circuit generates the pulse signal based on a first signal having self-refresh period information.

21. The semiconductor memory device of claim 20, wherein the row active control signal generating circuit includes:

an oscillator configured to generate the pulse signal that oscillates based on the at least one row active master signal;

at least one divider configured to generate one of the at least one row active control signal based on the pulse signal and a corresponding one of the at least one row active master signal; and a reset circuit configured to reset at least one divider based on a corresponding one of the at least one row active master signal.

22. The semiconductor memory device of claim 17, wherein the master signal generating circuit increases a retention time of each of the at least one row active master signal based on at least one retention time control signal having minimum retention time information associated with the at least one row active master signal.

23. The semiconductor memory device of claim 17, wherein the row active control signal generating circuit changes a time the at least one row active control signal is enabled based on at least one retention time control signal having a minimum retention time information associated with the at least one row active master signal.

24. The semiconductor memory device of claim 23, wherein the row active control signal generating circuit includes:

an oscillator configured to generate the pulse signal that oscillates based on the at least one row active master signal; and at least one divider configured to generate one of the at least one row active control signal based on the pulse signal, a corresponding one of the at least one retention time control signal, and a corresponding one of the at least one row active master signal.

* * * * *